VOLTAGE CONTROLLED PHASE SHIFT OSCILLATOR

Filed Aug. 11, 1965

INVENTOR
*Lewis M. Nielsen*

BY: *Harry M. Saragovitz, Edward J. Kelly & A. J. Dupont*
ATTORNEYS.

United States Patent Office 3,293,570
Patented Dec. 20, 1966

3,293,570

VOLTAGE CONTROLLED PHASE SHIFT OSCILLATOR

Lewis M. Nielsen, 1374 Thornton Ave., Salt Lake City, Utah 84110
Filed Aug. 11, 1965, Ser. No. 479,022
2 Claims. (Cl. 331—135)

The invention described herein may be manufactured and used by or for the Government for governmental purposes, without the payment to me of any royalty thereon.

This invention relates to phase shift oscillators and more particularly to a phase shift oscillator employing RC elements to create the desired phase shifts and whose frequency of oscillation varies in proportion to the voltage applied to the input thereof over a wide range of frequency with great stability.

Accordingly, it is an object of the invention to provide a new and novel phase shift oscillator that is voltage controlled.

A further object of the invention is a new and novel voltage controlled phase shift oscillator of high stability and infinite frequency variation.

A still further object of the invention is a new and novel voltage controlled phase shift oscillator including a resistance controlled oscillator wherein the frequency control circuit means thereof include variable amplitude clipper means.

Another object of the invention is a new and novel resistance controlled oscillator with infinite frequency variations.

Among other objects of the invention is a phase shift oscillator wherein the capacitors or resistors or both may be tuned so that the infinite frequency variations are obtained.

The invention will be more fully understood and its objects and advantages further appreciated by referring now to the following detailed specification taken in conjunction with the accompanying drawing in the several figures of which like numerals identify like elements and in which.

In general the invention basically consists of two RC phase shift circuits each capable of shifting the phase of an incoming frequency from zero to 180° depending on the value of the resistor, capacitor and frequency combination in combination with a voltage control means whereby frequency of oscillation is determined over wide frequency ranges.

Figure 1:
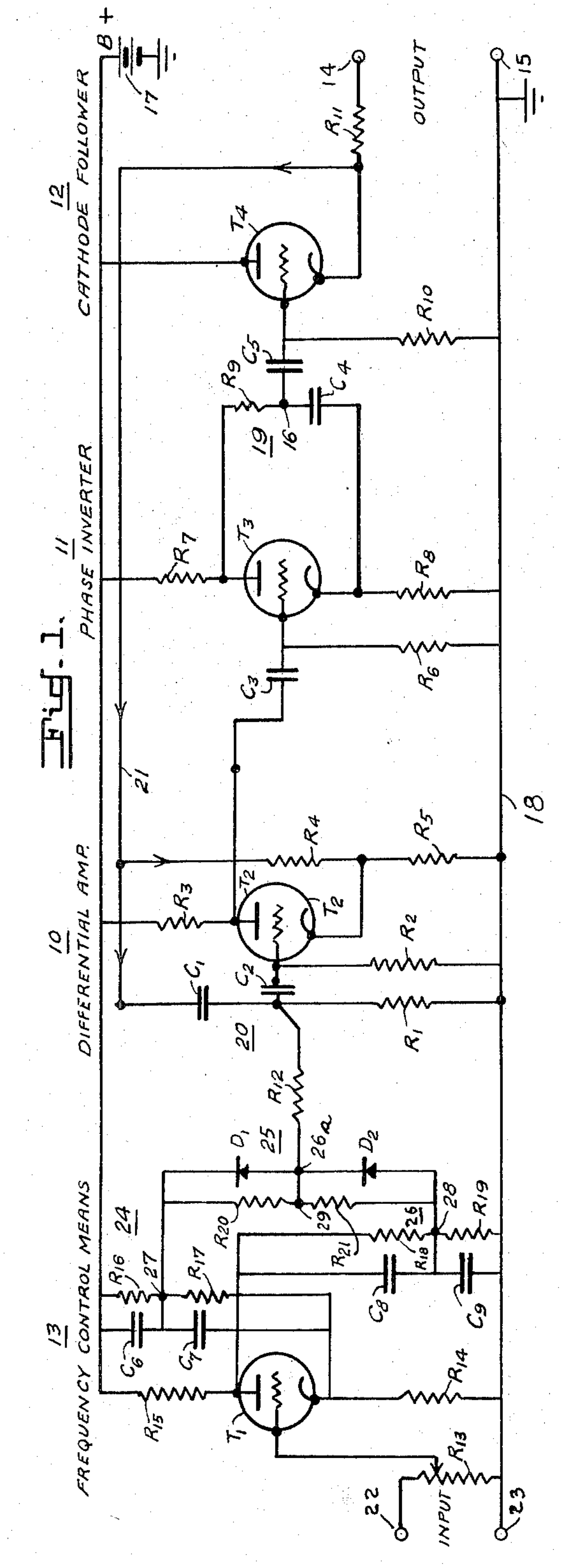
FIGURE 1 is a schematic diagram of the voltage controlled phase shift oscillator of the invention.

Referring now to the drawing, and particularly to FIGURE 1 wherein there is generally indicated differential amplifier 10, phase inverter 11, cathode follower 12 and associated circuitry comprising the phase shift oscillator. The frequency control means for the phase shift oscillator is generally indicated by reference numeral 13. The cathode follower 12 consisting of triode $T_4$ is utilized in the oscillator circuit because of its high input impedance and its low output impedance. The output of the oscillator is taken through the cathode resistor $R_{11}$ which isolates the load connected across output terminals 14–15 from the oscillator. Resistor $R_{10}$ is the D.C. return for the grid of triode $T_4$. The phase inverter 11 consisting of triode $T_3$, cathode resistor $R_8$ and plate load resistor $R_7$ is necessary for the operation of the second phase shifter 19. Phase shifter 19 consists of series connector resistor $R_9$ and capacitor $C_4$. The junction 16 formed by resistor $R_9$ and capacitor $C_4$ is coupled to the grid of triode $T_4$ by means of capacitor $C_5$. Phase inverter 11 employs a triode $T_3$ having its anode connected to the potential source 17 through resistor $R_7$ and its cathode connected to the common circuit 18 through resistor $R_8$. Resistors $R_7$ and $R_8$ are equal in value, across which are produced equal and opposite voltages. The output voltage at the cathode of triode $T_3$ is substantially equal and in phase with the input voltage at the grid of triode $T_3$. The output voltage at the anode of $T_3$ is also substantially equal to but 180° out of phase with the input voltage at the grid of $T_3$. The aforementioned second phase shifter 19 has its resistor terminal connected to the anode of triode $T_3$ and its capacitor terminal connected to the anode of triode $T_3$. The grid resistor $R_6$ connects the grid of triode $T_3$ with the ground or common circuit 18.

Figure 2:
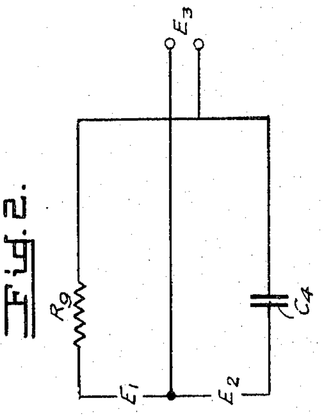
FIGURE 2 is a diagram showing the phase inverter and associated phase shifter of the invention as represented by two voltages out of phase with each other.

Referring now to FIGURE 2, it is mathematically shown in the following that the phase inverter 11 and phase shifter, $R_9$–$C_4$, can be represented by two voltages out of phase with each other. $E_1$ and $E_2$ represent the driving voltages from the anode and cathode, respectively, of triode $T_3$. $E_3$ represents the output voltage from phase shifter 19. A current I will flow through resistor $R_9$ and capacitor $C_4$ while the impedance at $E_3$ will be so high as to be negligible. The capacitive reactance of $C_4$ being represented by JX.

(1) $E_1-R_9I+E_3=0$
(2) $-E_2+JXI+E_3=0$
(3) $E_1-I_1R_9-JIX+E_2=0$

Solving (3) for I: $I=(E_1+E_2)/(R+JX)$

Adding (1) and (2): $E_1-E_2-\mathrm{I}(R-JX)+2E_3=0$

Substituting for I:

$$E_1-E_2-((E_1+E_2)(R-JX)/(R+JX)+2E_3=0$$
$$E_1-E_2-((E_1+E_2)(R-JX)^2)/(R_2+X^2)+2E_3=0$$
$$E_1-E_1-((E_1+E_2)(R^2-2JRX-X^2))/(R^2+X^2)=-2E_3$$
$$\therefore E_1-E_2-\frac{((E_1+E_2)(R^2+X^2))}{(R^2+X^2)}-\frac{(J(E_1+E_2)(2RX))}{(R^2+X^2)}=-2E_3$$

Now let $X_c=R$ and $R^2-X^2=0$:

$$E_1-E_2-\frac{((E_1+E_2)(0))}{(R^2+X^2)}-\frac{(J(E_1+E_2)(2RX))}{(R^2+X^2)}=-2E_3$$
$$E_1-E_2-\frac{((E_1+E_2)2R^2)}{(R^2+R^2)}=-2E_3$$
$$E_1-JE_1-E_2-JE_2=2E_3$$

and when $E_1=E_2$, $-J2E_2=-2E_3$ showing that the voltages are 90° out of phase when $X_c=R_9$ and when $E_1=E_2$. When $X_c=0$, the output voltage $E_3$, will be equal to the driving voltage $-E_2$ from the cathode and when $R_9=0$, the output voltage $E_3$ will be equal to the driving voltage $E_1$ from the anode, that is, at frequencies where $X_c$ is high enough to be negligible, the output voltage will be that of the anode and at frequencies where $X_c$ is low enough that $R_9$ is negligible, the output voltage would be the same as that of the cathode.

The differential amplifier 10 is driven by the first phase shifter 20 which consists of series connected capacitor $C_1$ and resistor $R_1$. The junction 30 formed by capacitor $C_1$ and resistor $R_1$ is coupled to the grid of triode $T_2$ by means of capacitor $C_2$. The terminal of capacitor $C_1$ is connected by means of conductor 21 to the cathode of cathode follower 12 which feeds back the output of the oscillator to drive phase shifter 20. The other terminal of resistor $R_1$ is returned to common circuit 18. Resistor $R_3$ is the load resistor for triode $T_3$ and couples the anode thereof to potential source 17. The differential amplifier voltage divider consists of series connected resistors $R_4$ and $R_5$. The junction formed by resistors $R_4$ and $R_5$ being conected to the cathode of triode $T_2$ with one terminal of the divider connected to feedback conductor 21 and the other terminal to common circuit 18. Resistor $R_2$ is the grid return of the differential amplifier 10. The combination of coupling capacitor $C_2$ and resistor $R_2$ make the input impedance of triode $T_2$ higher by reducing the grid current in triode $T_2$ resulting in the input impedance becoming more independent of heater voltages.

Figure 3:
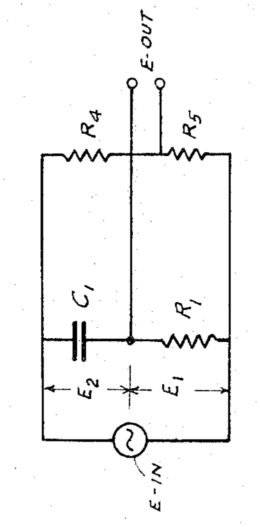
FIGURE 3 is a schematic representation of phase shift portion of the differential amplifier of the invention.

With reference to FIG. 3, a mathematical analysis of phase shifter 20 of differential amplifier 10 follows:

(1) $E_1=(E_{in}R_5)/(R_4+R_5)=E_{in}/2$
(2) $E_2=(E_{in}R_1)/(R_1+JX)$
(3) $E_0=E_1-E_2$

Rationalizing (2)

$$E_2=(E_{in}R(R-JX)/(R^2+X^2)$$
$$=(E_{in}R(R))/(R^2+X^2)-(JE_{in}R(X))/(R^2+X^2)$$

Let $X=R$ then:

$$E_2=(R^2E_{in})/(R^2+X^2)-(JE_{in}RX)/(R^2+X^2)$$
$$=E_{in}/2+JE_{in}/2$$

$E_1-E_2=E_0$ then:

$$E_0=E_{in}/2-E_{in}/2+JE_{in}/2$$
$$=JE_{in}/2$$

Thus, it can be seen that the output voltage $E_0$ will lead the input voltages $E_1$ and $E_2$ by 90° and at half the amplitude.

If $R=0$; $E_2=0$ and $E_1-E_2=+\frac{1}{2}E_{in}$
If $X_c=0$; $E_2=E_{in}$ and $E_1-E_2=-\frac{1}{2}E_{in}$ The above shows that the phase of the output voltage will vary from 0° to +180° and where $X_c=R$, the phase shift will be +90° and the output voltage equal in amplitude to half the applied voltage.

It can be seen from the aforegoing that the phase shifters will operate over an extremely broad frequency range to bring a phase shift of from 90° to 180° with no change in amplitude. Thus, it is only necessary to include only an amplifier 10 with a fixed gain to enable the phase shifters to function as an RC oscillator as shown in FIGURE 1. The oscillator will operate at a frequency where the sum of the phase shifters is capable of creating a phase shift of from 0° to 180° over a frequency range of D.C. to infinity. If the time constant of RC, phase shifter 20, is equal to the time constant of $R_9C_4$, phase shifter 19, then each phase shifter will add 90° to the signal voltage and the oscillator will oscillate at a frequency where $X_c$ is equal to R. If $R_1$ were reduced without changing $C_1$, $R_9$ or $C_4$ the frequency of the oscillations will increase. In the limit where $R_1$ is zero, the phase shift at the differential amplifier 10 will be zero, and the phase shift at the phase inverter 11 will be 180°, and the freqency of the oscillator would be infinite, limited only by the imperfections of the circuit components.

In order for the reactance of a capacitor to change 10:1, the frequency of the oscillations must change 10:1. If the reactance value of a capacitor in either phase shifter was equal to the resistance value of the resistor, then the phase shift would be 90° as shown above. Now to illustrate the frequency characteristics of the oscillator, using the above equations, when the reactance value of the capacitor were 10 times or 0.10 the value of the resistor, the phase shift would be:

*Phase shifter 19*

$$E_0=E_{in}/2-(E_{in}R(R))/(R+X_2)+(JE_{in}R(X))/(R_2+X_2)$$

Let $X_c=0.1R$:

$$E_0=E_{in}/2-(E_{in}R^2)/(R^2+0.01R^2)+(JE_{in}0.1R^2)/(R^2+0.01R^2)$$
$$=[0.49+J0.099]E_{in}$$
$$=0.5+\angle 168.6^\circ E_{in}$$

Let $X_c=10R$ $$E_0=0.5E_{in}-0.0099E_{in}+J0.0099E_{in}$$
$$=.5\ 11.4^\circ\ E_{in}$$

*Phase shifter 20*

Let $X_c=0.1R$ $$-2E_3=E_1-E_2-((E_1+E_2)(R^2-0.1R^2))/(R_2+0.01R^2)$$
$$=E_1-E_2-(E_1+E_2)(0.99)-(J(E_1+E_2)(0.2R^2))/(1.01)$$

Let $E_1=E_2=E_3$ $$-2E_3=(2E_{in}0.99)/(1.01)-(J(2E_{in})0.2)/(1.01)$$
$$=-1.96E_{in}-J0.395E_{in}$$
$$=2\angle -168.6^\circ$$
$$E_3=E_{in}\angle 11.4^\circ$$

Let $X_c=10R$ $$-2E_3=(-2E_{in}(-99R^2))/(101R^2)-(J2E_{in}20R^2)/(101R^2)$$
$$=1.96E_{in}-J0.395E_{in}$$
$$E_3=E_{in}\angle -168.6^\circ$$

Thus, it can be seen that both phase shifters behave identically with only the direction of the phase changing and that the frequency changes will be directly proportional to the resistance change. For example, if one of the frequency controlling resistors of one of the phase shifters were changed in value by a ratio of 100:1, the frequency change would be in the order of 10:1.

Thus far has been described the resistance controlled phase shift oscillator wherein the sine wave output thereof is fed back from the cathode follower 12 to phase shifter 20 which is capacity coupled to the grid of triode $T_2$ of differential amplifier 10. The output from the oscillator is also fed back to voltage divider $R_4$–$R_5$ to which the cathode of triode $T_2$ is connected at the midpoint of the divider. Frequency control means 13 is the means for converting a voltage into a resistance change whereby the frequency of oscillation of the resistance controlled oscillator described in the foregoing may be varied. The frequency control circuit 13 is a variable amplitude clipper consisting of triode $T_1$ which has its grid connected to the moving arm of potentiometer $R_{13}$ which has an input signal in the form of a D.C. voltage that may vary in a random or regular manner in time be applied thereto through input terminals 22–23. $R_{15}$ is the plate load resistor which couples the anode of triode $T_1$ to the potential source 17 and $R_{14}$ is the cathode resistor for triode $T_1$. Series connected resistors $R_{16}$ with parallel capacitor $C_6$ and $R_{17}$ with parallel capacitor $C_7$ comprise a voltage divider 24 having one of its terminals connected to the cathode of triode $T_1$ and its other terminal connected to plate load resistor $R_{15}$ and potential source 17. The center tap of divider 24 is connected to the cathode of diode $D_1$ of clipper 25. A voltage divider 26 consisting of series connected resistors $R_{18}$ with parallel capacitor $C_8$ and resistor $R_{19}$ with parallel capacitor $C_9$ has one terminal connected to the anode of triode $T_1$ and its other terminal connected to common circuit 18. The center tap of divider 26 is connected to the anode of diode $D_2$. The cathode of diode $D_2$ and the anode of diode $D_1$ form a junction 26a with the midtap 29 formed by resistor $R_{20}$ which is in parallel with diode $D_1$ and $R_{21}$ which is in parallel with diode $D_2$. Junction 26a is also coupled to junction 30 of phase shifter 20 and the grid of triode $T_2$ of differential amplifier 10.

As previously stated, the frequency control circuit 13 is a variable amplitude clipper. The amplitude of the clipped wave is controlled by the D.C. voltage applied to the input terminals 22–23 across resistor $R_{13}$. Assume the cathode and anode were connected externally then the junction 27 of resistor $R_{16}$ and resistor $R_{17}$ would be ¾B+ while the junction 28 of resistor $R_{18}$ and resistor $R_{19}$ would be ¼B+ and if the input voltage were sufficiently negative to cut off triode $T_1$ the voltage at junction 27 would be approximately equal to the voltage at the junction 28. In the first case, if an A.C. voltage from the resistance controlled oscillator were applied to junction 29 of resistor $R_{20}$ and resistor $R_{21}$ it will be clipped (*a*) when diode $D_1$ conducts while the instantaneous A.C. voltage applied at the junction 29 is positive with respect to the voltage at junction 27 and (*b*) when diode $D_2$ conducts while the instantaneous A.C. voltage applied at the junction 29 is negative with respect to the voltage at junction 28. The clipped action is the result of $D_1$ or $D_2$ conducting which presents a low resistance to the junction 29 of resistors $R_{20}$ and $R_{21}$ which is connected to junction 30 of the oscillator where the value of resistance will control the frequency of the oscillator. When the resistance controlled oscillator is used in conjunction with frequency control means 13, the resistor $R_1$ does not exist in the circuit but is replaced by the parallel combination of resistors $R_{20}$ and $R_{21}$, and resistor $R_{12}$ is the resistance represented by the forward conduction of either diode $D_1$ or diode $D_2$. The sine wave voltage applied to the junction of resistors $R_{12}$ and $R_2$ is the feedback voltage from the cathode of cathode follower 12. During the period of a cycle of the feedback voltage when the instantaneous value thereof is applied to the junction of resistors $R_2$ and $R_{12}$ is between the voltage value of the anode of diode $D_2$ and the cathode of diode $D_1$, the oscillator will operate at a low frequency. When a diode conducts as a result of the instantaneous value of feedback voltage applied to the junction of resistors $R_2$ and $R_{12}$ exceeding the voltage at the anode of diode $D_2$ or the cathode of diode $D_1$, the oscillator operates at a frequency determined by $R_{12}$ in parallel with resistors $R_{20}$ and $R_{21}$. The resultant wave form at the output of the clipper ($D_1$–$D_2$) will appear as a sine wave with various amounts of the positive and negative half cycles removed. In review, in the voltage controlled phase shift oscillator, the resistor $R_1$ in phase shifter 20 of differential amplifier 10 is replaced by the parallel combination of resistors $R_{20}$ and $R_{21}$. The frequency of the oscillations will be higher during the clipper conduction period of the cycle than during the nonconduction period. When the clipper is clipping to zero amplitude, the frequency of oscillation will be highest and when the clipper is open or not clipping the frequency of oscillation will be lowest.

Although a specific embodiment of the invention has been illustrated and described, it will be understood that this is but illustrative and that various modifications may be made therein without departing from the spirit of the invention and the scope of the appended claims.

I claim:

1. A voltage controlled phase shift oscillator comprising in combination, a common circuit, a pair of input terminals, a pair of output terminals, one terminal of each of said pairs of terminals connected to said common circuit; a potential source, a differential amplifier consisting of an electron discharge amplifier having anode, cathode and control electrodes, the anode of the differential amplifier coupled to said potential source through an anode load resistor; a first phase shifter consisting of a capacitor in series with paralleled resistors, each of said paralleled resistors having a diode connected thereacross, the junction formed by said parallel resistors and diodes and said capacitor coupled to said control electrode; a phase inverter consisting of a triode valve having its anode coupled through a load resistor to the positive terminal of said potential source and its cathode to the common circuit through its cathode resistor, the grid of said triode being capacitively coupled to the anode electrode of said electron discharge amplifier; a second phase shifter consisting of a series connected capacitor and resistor having its resistor terminal connected to the anode of said triode and its capacitor terminal to the cathode of said triode; a cathode follower having its grid element capacitively coupled to the output of said second phase shifter, its cathode element connected to one of said output terminals through a load decoupling resistor and its anode element connected to the positive terminal of said potential source; a feedback path consisting of an electrical conductor connecting the cathode element of said cathode follower to the capacitor of said first phase shifter and to a terminal of a voltage divider having its intermediate tap connected to the cathode of the differential amplifier and its other terminal connected to said common circuit; and voltage control means for varying the bias on said diodes whereby the resistance component of said first phase shifter is varied and hence the frequency of the phase shift oscillator.

2. The invention in accordance with claim 1 wherein said voltage control means comprises a vacuum tube having an anode, grid and cathode, a potentiometer connected across said input terminals having the rotating arm thereof connected to said grid, D.C. voltage signal means applied to the potentiometer through the input terminals whereby the grid bias may be varied, an anode load resistor coupling the anode and potential source, a cathode resistor coupling the cathode and common circuit, a first voltage divider provided with an intermediate tap and connected between the potential source and said cathode, a second voltage divider provided with an intermediate tap and connected between the anode and said common circuit, the cathode of one of said diodes being connected to the intermediate tap of the first voltage divider, the anode of the other of said diodes being connected to the intermediate tap of said second voltage divider, the junction formed by said diodes being coupled to the capacitor of the first phase shifter at the grid of the differential amplifier whereby the feedback voltage is applied to the junction and clipped by said diodes, the degree of clipping and hence the frequency of oscillation being controlled by the bias applied to said diodes in accordance with the bias applied to the grid of said vacuum tube through said potentiometer.

References Cited by the Examiner

UNITED STATES PATENTS 2,214,710 10/1965 Comer ------------- 331—135

FOREIGN PATENTS 1,015,580 10/1952 France.

OTHER REFERENCES

Fraser, Electronic Engineering, "A Wide Range RC Phase-Shift Oscillator," pages 200–202, May 1956.

NATHAN KAUFMAN, *Primary Examiner.*

J. KOMINSKI, *Assistant Examiner.*